United States Patent
Mitani et al.

[11] Patent Number: 5,982,041
[45] Date of Patent: Nov. 9, 1999

[54] SILICONE DIE ATTACH ADHESIVE, METHOD FOR THE FABRICATION OF SEMICONDUCTOR DEVICES, AND SEMICONDUCTOR DEVICES

[75] Inventors: Osamu Mitani; Kazumi Nakayoshi; Rikako Tazawa; Katsutoshi Mine, all of Chiba Prefecture, Japan

[73] Assignee: Dow Corning Toray Silicone Co., Ltd., Tokyo, Japan

[21] Appl. No.: 08/835,287

[22] Filed: Apr. 9, 1997

[30] Foreign Application Priority Data

Apr. 19, 1996 [JP] Japan ..................................... 8-122640

[51] Int. Cl.⁶ ........................ H01L 21/58; H01L 23/48; C09J 4/00; B32B 9/04
[52] U.S. Cl. ........................ 257/783; 438/118; 438/119; 156/329; 428/447; 528/31
[58] Field of Search ..................................... 438/118, 119; 156/329; 257/783; 428/447; 528/31

[56] References Cited

U.S. PATENT DOCUMENTS

| | | |
|---|---|---|
| 4,426,240 | 1/1984 | Louis et al. . |
| 5,145,931 | 9/1992 | Nakayoshi et al. ........................ 528/15 |
| 5,173,765 | 12/1992 | Nakayoshi et al. . |
| 5,789,516 | 8/1998 | Graiver et al. . |
| 5,804,631 | 9/1998 | Mine et al. . |

FOREIGN PATENT DOCUMENTS

| | | |
|---|---|---|
| 238033 | 9/1987 | European Pat. Off. . |
| 373659 | 6/1990 | European Pat. Off. . |
| WO 92/10543 | 6/1992 | WIPO . |

*Primary Examiner*—David E. Graybill
*Attorney, Agent, or Firm*—Paula J. Lagattuta; Richard I. Gearhart; Larry A. Milco

[57] ABSTRACT

A silicone die attach adhesive comprising a silicone composition that cures both through the free radical reaction of acrylic-functional organopolysiloxane as induced by exposure to high-energy radiation and through the hydrosilylation reaction between alkenyl-functional organopolysiloxane and silicon-bonded hydrogen-functional organopolysiloxane.

Also, a fabrication method characterized by
mounting a semiconductor chip on a substrate or in a package with the aforesaid silicone die attach adhesive sandwiched between the semiconductor chip and substrate or package,
then inducing the free radical reaction of the acrylic functional groups by exposing the die attach adhesive to high-energy radiation, and thereafter
curing the die attach adhesive by the hydrosilylation reaction.

A semiconductor device characterized in that it has been fabricated by the above-described method.

13 Claims, 2 Drawing Sheets

SILICONE DIE ATTACH ADHESIVE, METHOD FOR THE FABRICATION OF SEMICONDUCTOR DEVICES, AND SEMICONDUCTOR DEVICES

BACKGROUND OF THE INVENTION

1. Field of the Invention

This invention relates to siloxane compositions useable as silicone die attach adhesives, methods for the fabrication of semiconductor devices, and semiconductor devices. More particularly, the present invention relates to a silicone die attach adhesive that during the bonding of a semiconductor chip on a substrate or package suppresses the outmigration of low-molecular-weight silicone oil that causes impaired wire bondability to the semiconductor chip or lead frame and defective bonding between the resin sealant and the semiconductor chip, substrate, package, and/or lead frame. The invention also relates to a method for semiconductor device fabrication that, through the use of said die attach adhesive, avoids deterioration in wire bondability to the semiconductor chip or lead frame and avoids defective bonding between the resin sealant and the semiconductor chip, substrate, package, and/or lead frame. The invention further relates to the highly reliable (moisture resistance and so forth) semiconductor devices that are afforded by the fabrication method.

2. Description of the Related Art

Semiconductor devices are typically fabricated by first bonding a semiconductor chip to a substrate or package using a solder such as Au/Si eutectic, or using an epoxy, polyimide, or silicone die attach adhesive. The semiconductor chip and lead frame are then electrically connected by a wire bonding operation using, for example, gold or aluminum bonding wires, and the semiconductor chip is thereafter resin-sealed using, for example, epoxy resin or polyphenylene sulfide resin. The use of silicone die attach adhesives is highly desirable because they are able to relax the stresses that are induced in the semiconductor chip. However, the heretofore known silicone die attach adhesives cause an impairment in the wire bondability between semiconductor chip and lead frame and defective bonding between the resin sealant and semiconductor chip, substrate, package, and/or lead frame. This in turn has resulted in a diminished reliability for the resulting semiconductor devices as evidenced, for example, by the moisture resistance and the like.

In response to this, Japanese Patent Application Laid Open (Kokai) Number Hei 3-157474(1991) has proposed a silicone die attach adhesive with a reduced content of volatile low-molecular-weight siloxane comprising a hydrosilylation-curing silicone composition. However, even this silicone die attach adhesive cannot provide an acceptable suppression of either the impaired wire bondability to the semiconductor chip and lead frame or the defective bonding between the resin sealant and semiconductor chip, substrate, package, and/or lead frame, and as a result this adhesive cannot provide an acceptable improvement in semiconductor device reliability as evidenced by the moisture resistance and so forth.

With respect to the bonding of semiconductor chips to a substrate or package using a silicone die attach adhesive comprising a hydrosilylation-curing silicone composition, various investigations have confirmed that contamination of the surface of the semiconductor chip, substrate, package, lead frame, etc., by low-molecular-weight silicone oil outmigrating from the silicone die attach adhesive prior to the hydrosilylation reaction and during cure by the hydrosilylation reaction causes the deterioration in wire bondability to the semiconductor chip or lead frame and defective bonding between the sealant resin and semiconductor chip, substrate, package, and/or lead frame. This low-molecular-weight silicone oil has been confirmed to be the straight-chain and cyclic siloxane oligomer present in the organopolysiloxane that is the main component of such silicone die attach adhesives, straight-chain and cyclic siloxane oligomer present in the organopolysiloxane used to cure such die attach adhesives, and straight-chain and cyclic siloxane oligomer present in organopolysiloxane admixed for the purpose of improving the adhesive properties of such die attach adhesives.

The present inventors attempted to inhibit this outmigration of low-molecular-weight silicone oil from the silicone composition prior to and during its cure by preparing a silicone composition that cured immediately through the hydrosilylation reaction even at room temperature. However, the handling properties of this silicone composition were so severely compromised that it was unfit for use as a die attach adhesive.

In another attempt to inhibit this outmigration of low-molecular-weight silicone oil prior to and during the cure of the silicone composition, the present inventors also prepared a silicone composition that cured by the free radical reaction of an acrylic-functional organopolysiloxane as induced by exposure to high-energy radiation. However, this silicone composition also proved unsuitable for application as a die attach adhesive due to the failure of regions not receiving high-energy radiation to achieve complete cure, such as, for example, the silicone composition underlying the semiconductor chip.

As a result of extensive investigations directed to solving the problems described above, the inventors have discovered that these problems can be solved by mounting the semiconductor chip on the substrate or package using a silicone composition that cures both by the free radical reaction of acrylic-functional organopolysiloxane as induced by high-energy radiation and by the hydrosilylation reaction between alkenyl-functional organopolysiloxane and SiH-functional organopolysiloxane. The inventors found that when the composition pressed out around the circumference of the semiconductor chip is thereafter exposed to high-energy radiation, the free radical reaction of the acrylic functional groups proceeding at the surface of the composition provides a thorough inhibition of outmigration of the low-molecular-weight silicone oil from the silicone composition prior to its hydrosilylation reaction and during cure by the hydrosilylation reaction. The inventors also found that those regions not receiving adequate doses of high-energy radiation were cured by the hydrosilylation reaction. The invention was achieved based on these discoveries.

In specific terms, an object of the present invention is to provide a silicone die attach adhesive that during bonding of the semiconductor chip to a substrate or package suppresses the outmigration of low-molecular-weight silicone oil that causes impaired wire bondability to the semiconductor chip or lead frame and defective bonding between the resin sealant and the semiconductor chip, substrate, package, and/or lead frame. Another object of the present invention is to provide a method for semiconductor device fabrication that through the use of the aforesaid die attach adhesive avoids deterioration in wire bondability to the semiconductor chip or lead frame and avoids defective bonding between the resin sealant and the semiconductor chip, substrate, package, and/or lead frame. A further object of the present invention is to provide the highly reliable (moisture resistance and so forth) semiconductor devices that are afforded by the aforesaid fabrication method.

SUMMARY OF THE INVENTION

The silicone die attach adhesive according to the present invention characteristically comprises a silicone composition that cures both through the free radical reaction of acrylic-functional organopolysiloxane as induced by exposure to high-energy radiation and through the hydrosilylation reaction between alkenyl-functional organopolysiloxane and silicon-bonded hydrogen-functional organopolysiloxane.

The fabrication method according to the present invention is characterized by mounting a semiconductor chip on a substrate or in a package with the aforesaid silicone die attach adhesive sandwiched between the semiconductor chip and substrate or package, then inducing the free radical reaction of the acrylic functional groups by exposing the die attach adhesive to high-energy radiation, and thereafter curing the die attach adhesive by the hydrosilylation reaction.

Semiconductor devices according to the present invention are characteristically fabricated by the above-described method.

Figure 1:
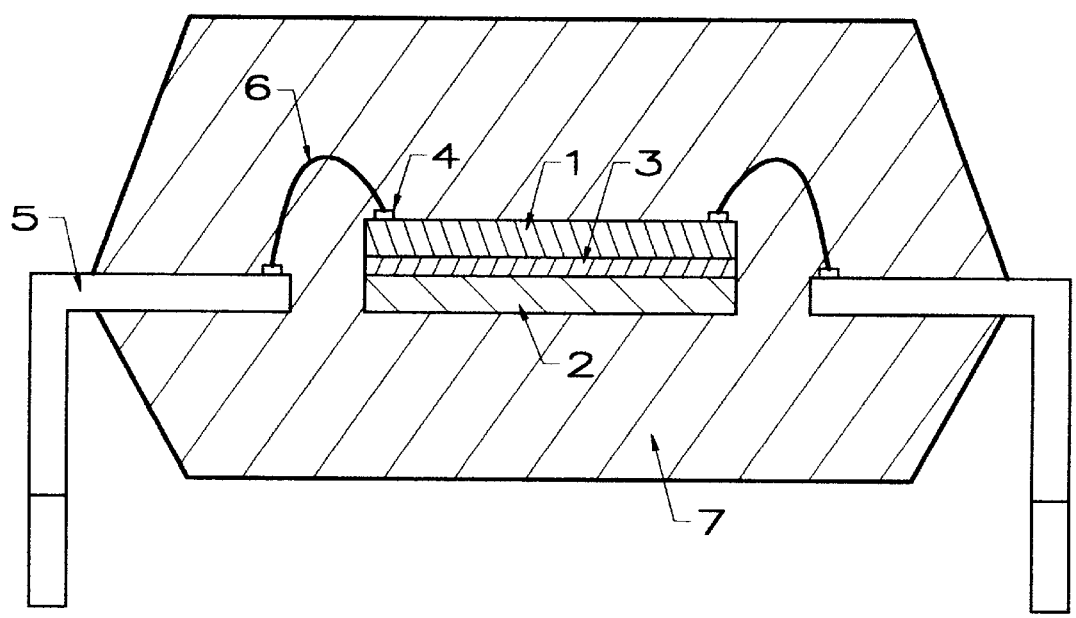
FIG. 1 is a cross-sectional drawing of the semiconductor device used in the examples.

| | Reference numbers |
|---|---|
| 1 | semiconductor chip |
| 2 | tab |
| 3 | cured silicone die attach adhesive |
| 4 | aluminum bonding pad |
| 5 | copper lead frame |
| 6 | gold bonding wire |
| 7 | epoxy resin sealant |
| 8 | ceramic circuit substrate |
| 9 | copper circuit interconnect |
| 10 | electrical elements such as capacitors, resistors, etc. |

DETAILED DESCRIPTION OF THE INVENTION

The silicone die attach adhesive according to the present invention will be explained in detail below.

The silicone die attach adhesive according to the present invention characteristically comprises a siloxane composition that cures both through the free radical reaction of acrylic-functional organopolysiloxane as induced by exposure to high-energy radiation and through the hydrosilylation reaction between alkenyl-functional organopolysiloxane and silicon-bonded hydrogen-functional organopolysiloxane. The high-energy radiation is exemplified by visible light, ultraviolet light, x-rays, and electron beam, with ultraviolet radiation being preferred from a practical standpoint. The acrylic group, methacrylic group, and hydroxymethacrylic group are examples of the acrylic functionality that undergoes free radical reaction upon exposure to high-energy radiation. The methacrylic group is preferred from a practical standpoint. The acrylic functionality can be directly bonded to the silicon in the organopolysiloxane constituent of the silicone composition or can be bonded to the silicon in this organopolysiloxane across a divalent organic group such as, for example, alkylene, oxyalkylene, alkyleneoxyalkylene and the like. The hydrosilylation reaction, which can be accelerated by heating, refers to the addition of the silicon-bonded hydrogen atom to alkenyl. The alkenyl is preferably selected from the group consisting of vinyl, allyl, butenyl, pentenyl, and hexenyl. In addition, the acrylic functionality can also participate in the hydrosilylation reaction to some extent.

A preferred embodiment of the subject silicone die attach adhesive is the silicone composition (hereinafter referred to as the first-named silicone composition) comprising (A) 100 weight parts of an organopolysiloxane mixture consisting essentially of:

(a) 5 to 95 weight % of an acrylic functional group constaining organopolysiloxane having in each molecule at least 2 silicon-bonded acrylic functional groups having the following formula:

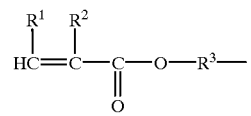

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group, and (b) 95 to 5 weight % of an alkenyl containing organopolysiloxane having at least 2 silicon-bonded alkenyl groups in each molecule;

(B) an organohydrogenpolysiloxane having at least 2 silicon-bonded hydrogen atoms in each molecule, in a quantity that provides from 0.5 to 20 moles of silicon-bonded hydrogen from this component (B) per 1 mole of silicon-bonded alkenyl in component (b);

(C) 0.01 to 10 parts by weight of a photosensitizer; and (D) platinum catalyst in sufficient quantity to cure the present composition.

Another preferred embodiment of the subject silicone die attach adhesive is the silicone composition (hereinafter referred to as the second-named silicone composition) comprising (A') 100 parts by weight of an alkenyl containing organopolysiloxane having in each molecule at least 2 silicon-bonded alkenyl groups and that may or may not contain the acrylic functional group with the following formula bonded to silicon

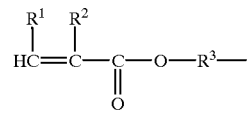

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group;

(B') an organohydrogenpolysiloxane having at least 2 silicon-bonded hydrogen atoms in each molecule and that may or may not contain the acrylic functional group with the following formula bonded to silicon

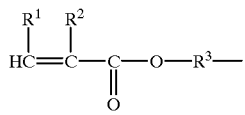

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group), in a quantity that provides from 0.5 to 20 moles of silicon-bonded hydrogen from this component (B') per 1 mole of silicon-bonded alkenyl in component (A');

(C) 0.01 to 10 parts by weight of a photosensitizer; and (D) platinum catalyst in sufficient quantity to cure the present composition;

wherein at least 1 of components (A') and (B') contains in each molecule at least 2 silicon-bonded acrylic functional groups having the following formula:

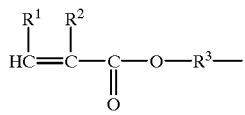

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group.

The first-named silicone composition will be considered in detail below.

Component (A), which is the base ingredient of the first-named silicone composition, is an organopolysiloxane mixture comprising:

(a) 5 to 95 weight % of an acrylic functional group containing organopolysiloxane having in each molecule at least 2 silicon-bonded acrylic functional groups having the following formula:

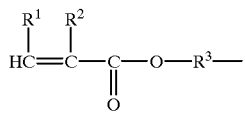

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group, and (b) 95 to 5 weight % of an alkenyl containing organopolysiloxane having at least 2 silicon-bonded alkenyl groups in each molecule.

Component (A) will contain from 5 to 95 weight % component (a) with the remaining weight % consisting of component (b). When the silicone composition has less than 5 weight % component (a) in component (A), the free radical reaction of the acrylic functionality does not proceed to an acceptable degree upon exposure to high-energy radiation and the objects of the invention will as a result not be achieved. The silicone composition having more than 95 weight % component (a) in component (A) will not undergo a thorough cure by the hydrosilylation reaction and will as a result be unfit for application as a die attach adhesive.

Component (a) is an acrylic functional group containing organopolysiloxane having in each molecule at least 2 silicon bonded acrylic functional groups having the formula:

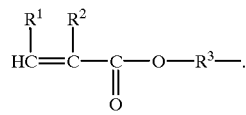

When each molecule of this organopolysiloxane contains fewer than 2 of the described acrylic functional groups, the free radical reaction of the acrylic functionality does not proceed to an acceptable degree upon exposure of the corresponding silicone composition to high-energy radiation and the objects of the invention will as a result not be achieved. $R^1$ in the preceding formula is a hydrogen atom or a monovalent hydrocarbon group. When $R^1$ is a monovalent hydrocarbon group, $R^1$ is preferably selected from the group consisting of alkyl groups, such as methyl, ethyl and propyl; alkenyl groups, such as vinyl and allyl; aryl groups, such as phenyl, tolyl and xylyl; and aralkyl groups, such as benzyl and phenethyl. $R^2$ in the preceding formula is a hydrogen atom and or a monovalent hydrocarbon group. When $R^2$ is monovalent hydrocarbon groups, it is exemplified by the monovalent hydrocarbon groups provided above for $R^1$. $R^3$ in the preceding formula is a $C_1$ to $C_{10}$ divalent hydrocarbon group and is preferably selected from the group consisting of ethylene, ethylene, propylene, butylene, and pentylene. Propylene is preferred for $R^3$. The acrylic functional group under consideration preferrably selected from the group consisting of 3-acryloxypropyl, 4-acryloxybutyl, and 3-methacryloxypropyl, with 3-methacryloxypropyl being particularly preferred. The acrylic functional group can be bonded at terminal or pendant position on the molecular chain, but the terminal position on the molecular chain is preferred for the good reactivity it affords.

The other silicon-bonded groups in component (a) are exemplified by substituted and unsubstituted monovalent hydrocarbon groups. The other silicone bonded groups in component (a) are preferably selected from the group consisting of alkyl groups, such as methyl, ethyl, propyl, butyl, pentyl, hexyl, heptyl, octyl, nonyl, decyl and octadecyl; cycloalkyl groups, such as cyclopentyl and cyclohexyl; alkenyl groups, such as vinyl, allyl, butenyl, pentenyl, hexenyl and heptenyl; aryl groups, such as phenyl, tolyl, xylyl and naphthyl; aralkyl groups, such as benzyl, phenethyl and phenylpropyl; and halogenated alkyl groups, such 3-chloropropyl and 3,3,3-trifluoropropyl. Additional examples of the other silicon-bonded groups in component (a) are the hydrogen atom, hydroxyl group, and alkoxy groups. The preferred alkoxy group is preferably selected from the group consisting of methoxy, ethoxy, propoxy, butoxy, methoxymethoxy and methoxyethoxy. Methyl and phenyl are particularly preferred among the preceding.

The molecular structure of component (a) can be, for example, straight chain, partially branched straight chain, branched chain, cyclic, or network with straight-chain structures being preferred. The viscosity of component (a) at 25° C. is preferably from 20 to 200,000 centipoise (20 to 200,000 mPa.s) and more preferably from 500 to 20,000 centipoise (500 to 20,000 mPa.s) because such values afford good handling characteristics in the corresponding silicone composition and good physical properties, e.g., flexibility, elongation, etc., in the corresponding cured product.

Component (a) is preferably selected from the group consisting of:

3-methacryloxypropyldimethoxysiloxy-endblocked methylvinylpolysiloxanes;

3-methacryloxypropyldimethoxysiloxy-endblocked dimethylsiloxane-methylvinylsiloxane copolymers;

3-methacryloxypropyldiethoxysiloxy-endblocked methylvinylpolysiloxanes;
3-methacryloxypropyldiethoxysiloxy-endblocked dimethylsiloxane-methylvinylsiloxane copolymers;
trimethylsiloxy-endblocked methylvinylsiloxane-methyl (trimethoxysilylethyl)siloxane-methyl(3-methacryloxypropyl)siloxane copolymers;
trimethylsiloxy-endblocked dimethylsiloxane-methylvinylsiloxane-methyl(trimethoxysilylethyl)siloxane-methyl(3-methacryloxypropyl)siloxane copolymers;
3-acryloxypropyldimethoxysiloxy-endblocked methylvinylpolysiloxanes;
3-acryloxypropyldimethoxysiloxy-endblocked dimethylsiloxane-methylvinylsiloxane copolymers;
3-acryloxypropyldiethoxysiloxy-endblocked methylvinylpolysiloxanes;
3-acryloxypropyldiethoxysiloxy-endblocked dimethylsiloxane-methylvinylsiloxane copolymers;
trimethylsiloxy-endblocked methylvinylsiloxane-methyl (trimethoxysilylethyl)siloxane-methyl(3-acryloxypropyl)siloxane copolymers;
trimethylsiloxy-endblocked dimethylsiloxane-methylvinylsiloxane-methyl (trimethoxysilylethyl)siloxane-methyl(3-acryloxypropyl)siloxane copolymers;
organopolysiloxanes comprising $CH_2=CHCOOC_3C_6(CH_3O)_2SiO_{1/2}$ and $SiO_{4/2}$ units;
organopolysiloxanes comprising $(CH_3)_3SiO_{1/2}$, $CH_2=CHCOOC_3C_6(CH_3O)_2SiO_{1/2}$, and $SiO_{4/2}$ units;
organopolysiloxanes comprising $(CH_3)_3SiO_{1/2}$, $CH_2=CHCOOC_3C_6(CH_3O)_2SiO_{1/2}$, $(CH_3)_2SiO_{2/2}$, and $SiO_{4/2}$ units;
organopolysiloxanes comprising $CH_2=C(CH_3)COOC_3C_6(CH_3O)_2SiO_{1/2}$ and $SiO_{4/2}$ units;
organopolysiloxanes comprising $(CH_3)_3SiO_{1/2}$, $CH_2=C(CH_3)COOC_3C_6(CH_3O)_2SiO_{1/2}$, and $SiO_{4/2}$ units;
organopolysiloxanes comprising $(CH_3)_3SiO_{1/2}$, $CH_2=C(CH_3)COOC_3C_6(CH_3O)_2SiO_{1/2}$, $(CH_3)_2SiO_{2/2}$, and $SiO_{4/2}$ units; and
mixtures of two or more selections from the preceding organopolysiloxanes.

Component (b) is an alkenyl containing organopolysiloxane having at least 2 silicon-bonded alkenyl groups in each molecule. In the case of organopolysiloxane containing fewer than 2 silicon-bonded alkenyl groups in each molecule, the corresponding silicone composition will not be thoroughly cured by the hydrosilylation reaction and hence will be unfit for application as a die attach adhesive. The alkenyl can be bonded at terminal or pendant position on the molecular chain, with terminal position being preferred for the good reactivity it affords. The alkenyl group is preferrably selected from the group consisting of vinyl, allyl, butenyl, pentenyl, hexenyl, and heptenyl, with vinyl being particularly preferred. The other silicon-bonded groups in component (b) are exemplified by substituted and unsubstituted monovalent hydrocarbon groups such as alkyl groups. The other silicone bonded groups in component (b) are alkyl groups, such as methyl, ethyl, propyl, butyl, pentyl, hexyl, heptyl, octyl, nonyl, decyl and octadecyl; cycloalkyl groups such as cyclopentyl and cyclohexyl; aryl groups, such as phenyl, tolyl, xylyl and naphthyl; aralkyl groups, such as benzyl, phenethyl and phenylpropyl; and halogenated alkyl groups, such 3-chloropropyl and 3,3,3-trifluoropropyl. Additional examples of the other silicon-bonded groups in component (b) are the hydroxyl group and alkoxy groups. The preferred alkoxy group is preferrably selected from the group consisting of methoxy, ethoxy, propoxy, butoxy, methoxymethoxy and methoxyethoxy. Methyl and phenyl are preferred among the preceding. The molecular structure of component (b) can be, for example, straight chain, partially branched straight chain, branched chain, cyclic, or network with straight-chain structures being preferred. The viscosity of component (b) at 25° C. is preferably from 20 to 200,000 centipoise (20 to 200,000 mPa.s) and more preferably from 500 to 20,000 centipoise (500 to 20,000 mPa.s) because such values afford good handling characteristics in the corresponding silicone composition and good physical properties, e.g., flexibility, elongation, etc., in the corresponding cured product.

Component (b) is preferably selected from the group consisting of trimethylsiloxy-endblocked dimethylsiloxane-methylvinylsiloxane copolymers;
trimethylsiloxy-endblocked methylvinylpolysiloxanes;
trimethylsiloxy-endblocked dimethylsiloxane-methylvinylsiloxane-methylphenylsiloxane copolymers;
dimethylvinylsiloxy-endblocked dimethylpolysiloxanes;
dimethylvinylsiloxy-endblocked dimethylsiloxane-methylvinylsiloxane copolymers;
dimethylvinylsiloxy-endblocked dimethylsiloxane-methylvinylsiloxane-methylphenylsiloxane copolymers;
organopolysiloxanes comprising $(CH_2=CH)(CH_3)_2SiO_{1/2}$ and $SiO_{4/2}$ units;
organopolysiloxanes comprising $(CH_3)_3SiO_{1/2}$, $(CH_2=CH)(CH_3)_2SiO_{1/2}$, and $SiO_{4/2}$ units;
organopolysiloxanes comprising $(CH_3)_3SiO_{1/2}$, $(CH_2=CH)(CH_3)_2SiO_{1/2}$, $(CH_3)_2SiO_{2/2}$, and $SiO_{4/2}$ units; and
mixtures of two or more selections from the preceding organopolysiloxanes.

Component (B), which functions to cure the first-named silicone composition, is an organohydrogenpolysiloxane having at least 2 silicon-bonded hydrogen atoms in each molecule. In the case of an organohydrogenpolysiloxane containing fewer than 2 silicon-bonded hydrogen in each molecule, the corresponding silicone composition will not be thoroughly cured by the hydrosilylation reaction and hence will be unfit for application as a die attach adhesive. The hydrogen can be bonded at terminal or pendant position on the molecular chain. The other silicon-bonded groups in component (B) are exemplified by substituted and unsubstituted monovalent hydrocarbon groups. The other silicon bonded groups in component (B) are preferably selected from the group consisting of alkyl groups, such as methyl, ethyl, propyl, butyl, pentyl, hexyl, heptyl, octyl, nonyl, decyl and octadecyl; cycloalkyl groups, such as cyclopentyl and cyclohexyl; aryl groups, such as phenyl, tolyl, xylyl and naphthyl; aralkyl groups, such as benzyl, phenethyl and phenylpropyl; and halogenated alkyl groups such as 3-chloropropyl and 3,3,3-trifluoropropyl. Additional examples of the other silicon-bonded groups in component (B) are the hydroxyl group and alkoxy groups. The preferred alkoxy group is preferably selected from the group consisting of methoxy, ethoxy, propoxy, butoxy, methoxymethoxy and methoxyethoxy. Methyl and phenyl are particularly preferred among the preceding. The molecular structure of component (B) can be, for example, straight chain, partially branched straight chain, branched chain, cyclic, or network with straight-chain structures being preferred. The viscosity of component (B) at 25° C. is preferably from 1 to 50,000 centipoise (1 to 50,000 mPa.s) and more preferably from 5 to 1,000 centipoise (5 to 1,000 mPa.s) because such values afford good handling characteristics as well as a good ingredient stability for the ultimately obtained silicone composition.

Component (B) is preferably selected from the group consisting of trimethylsiloxy-endblocked methylhydrogenpolysiloxanes;

trimethylsiloxy-endblocked dimethylsiloxane-methylhydrogensiloxane copolymers;
dimethylhydrogensiloxy-endblocked dimethylpolysiloxanes;
dimethylhydrogensiloxy-endblocked dimethylsiloxane-methylhydrogensiloxane copolymers;
organopolysiloxanes comprising $(CH_3)_2HSiO_{1/2}$ and $SiO_{4/2}$ units;
organopolysiloxanes comprising $(CH_3)_3SiO_{1/2}$, $(CH_3)_2HSiO_{1/2}$, and $SiO_{4/2}$ units;
organopolysiloxanes comprising $(CH_3)_3SiO_{1/2}$, $(CH_3)_2HSiO_{1/2}$, $(CH_3)_2SiO_{2/2}$, and $SiO_{4/2}$ units; and
mixtures of two or more selections from the preceding organopolysiloxanes.

Component (B) is added in a quantity that provides from 0.5 to 20 moles silicon-bonded hydrogen in component (B) per 1 mole silicon-bonded alkenyl in component (b). The hydrosilylation reaction will not yield a thorough cure, and the silicone composition will thus be unfit for application as a die attach adhesive, when component (B) provides the silicone composition with less than 0.5 mole silicon-bonded hydrogen per 1 mole silicon-bonded alkenyl in component (b). The composition will foam during its cure when component (B) provides more than 20 moles silicon-bonded hydrogen per 1 mole silicon-bonded alkenyl in component (b).

The photosensitizer (C) functions to accelerate the free radical reaction by the acrylic functionality in component (a) during exposure of the first-named silicone composition to high-energy radiation. Component (C) is preferably selected from the group consisting of acetophenone and derivatives thereof. In more preferred embodiments component (C) is selected from the group consisting of dichloroacetophenone, trichloroacetophenone, tert-butyltrichloroacetophenone, 2,2-diethoxyacetophenone and p-dimethylaminoacetophenone; benzoin and derivatives thereof, such as benzoin methyl ether, benzoin ethyl ether, benzoin isobutyl ether and benzoin butyl ether; benzophenone and its derivatives such as 2-chlorobenzophenone, p,p'-dichlorobenzophenone and p,p'-bisdiethylaminobenzophenone; p-dimethylaminopropiophenone; hydroxyisobutyrophenone; Michler's ketone; benzil; benzil dimethyl ketal; tetramethylthiuram monosulfide; thioxanthone; 2-chlorothioxanthone; 2-methylthioxanthone; azoisobutyronitrile; benzoin peroxide; di-tert-butyl peroxide; 1-hydroxycyclohexyl phenyl ketone; 2-hydroxy-2-methyl-1-phenylpropan-1-one; 1-(4-isopropylphenyl)-2-hydroxy-2-methylpropan-1-one; methyl benzoylformate; diphenyl sulfide; anthracene; 1-chloroanthraquinone; diphenyl disulfide; diacetyl; hexachlorobutadiene; pentachlorobutadiene; 1-chloromethylnaphthalene; and mixtures of two or more selections from these photosensitizers. The nost preferred photosensitizers are acetophenone, benzoin, benzophenone, and their derivatives.

Component (C) is added at from 0.01 to 10 weight parts and preferably at from 0.5 to 5 weight parts, in each case per 100 weight parts component (A). The objects of the present invention cannot be achieved at below 0.01 weight part component (C) per 100 weight parts component (A) due to the resulting weak free radical reaction by the acrylic functionality when the corresponding silicone composition is exposed to high-energy radiation. The silicone composition containing more than 10 weight parts (C) per 100 weight parts (A) suffers from such problems as a poor storage stability and poor handling characteristics.

The platinum catalyst (D) functions to accelerate the hydrosilylation reaction in the first-named silicone composition. Component (D) is preferably selected from the group consisting of platinum black, platinum-on-active carbon, platinum-on-silica micropowder, chloroplatinic acid, alcohol solutions of chloroplatinic acid, platinum-olefin complexes, platinum-vinylsiloxane complexes, and microparticulate catalysts comprising thermoplastic resin containing a platinum catalyst as described above. The subject thermoplastic resin is preferably selected from the group consisting of silicone resins, polycarbonate resins, acrylic resins, nylon resins, and polyester resins. The thermoplastic resin preferably has a softening point from 5° C. to 200° C. and preferably has a particle size from 0.01 to 10 μm.

Component (D) is added in sufficient quantity to cure the first-named silicone composition. In specific terms, component (D) is added in an amount that provides the first-named silicone composition with preferably from 0.01 to 1,000 weight-ppm and more preferably from 0.5 to 500 weight-ppm platinum metal in component (D).

The second-named silicone composition will now be considered in detail.

Component (A'), which is the base ingredient of the second-named silicone composition, is an alkenyl containing organopolysiloxane that contains at least 2 silicon-bonded alkenyl groups in each molecule and that may or may not contain the silicon bonded acrylic functional group having the following formula bonded to silicon

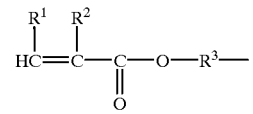

in which $R^1$ is hydrogen or a monovalent hydrocarbon group, $R^2$ is hydrogen or a monovalent hydrocarbon group, and $R^3$ is a $C_1$ to $C_{10}$ divalent hydrocarbon group. Component (A') should have at least 2 silicon-bonded alkenyl groups in each molecule. When each molecule of component (A') contains fewer than 2 silicon-bonded alkenyl groups, the corresponding silicone composition will not be thoroughly cured by the hydrosilylation reaction and hence will be unfit for application as a die attach adhesive. The alkenyl is preferably selected from the group consisting of vinyl, allyl, butenyl, pentenyl, hexenyl, and heptenyl with vinyl being particularly preferred. The alkenyl can be bonded at terminal or pendant position on the molecular chain. The other silicon-bonded groups in component (A') are preferably selected from the group consisting of alkyl groups such as methyl, ethyl, propyl, butyl, pentyl, hexyl, heptyl, octyl, nonyl, decyl and octadecyl; cycloalkyl groups, such as cyclopentyl and cyclohexyl; aryl groups, such as phenyl, tolyl, xylyl and naphthyl; aralkyl groups, such as benzyl, phenethyl and phenylpropyl; halogenated alkyl groups, such 3-chloropropyl and 3,3,3-trifluoropropyl; alkoxy groups, such as methoxy, ethoxy, propoxy, butoxy, methoxymethoxy and methoxyethoxy; and a hydroxyl group. Methyl and phenyl are most preferred among the preceding. When each molecule of component (B') contains only 1 of the above-defined acrylic functional groups or is entirely free of this functionality, component (A') must then contain in each molecule at least 2 of the subject acrylic functional groups in order to achieve a satisfactory development of the free radical reaction of the acrylic functionality when the corresponding silicone composition is exposed to high-energy radiation. The molecular structure of component (A') can be, for example, straight chain, partially branched straight chain, branched chain, cyclic, or network. The viscosity of component (A') at 25° C. is preferably from 20 to 200,000 centipoise (20 to 200,000 mPa.s) and more preferably from 500 to 20,000 centipoise (50 to 20,000 mPa.s) because such values afford good handling characteristics in the corresponding silicone composition and good physical properties, e.g., flexibility, elongation, etc., in the corresponding cured product.

The subject component (A') is exemplified by the organopolysiloxanes provided above for component (b). organopolysiloxanes that also contain the above-defined acrylic functionality bonded to silicon are exemplified by
3-methacryloxypropyldimethoxysiloxy-endblocked methylvinylpolysiloxanes,
3-methacryloxypropyldimethoxysiloxy-endblocked dimethylsiloxane-methylvinylsiloxane copolymers,
3-methacryloxypropyldiethoxysiloxy-endblocked methylvinylpolysiloxanes,
3-methacryloxypropyldiethoxysiloxy-endblocked dimethylsiloxane-methylvinylsiloxane copolymers,
trimethylsiloxy-endblocked methylvinylsiloxane-methyl (trimethoxysilylethyl)siloxane-methyl(3-methacryloxypropyl)siloxane copolymers,
trimethylsiloxy-endblocked dimethylsiloxane-methylvinylsiloxane-methyl(trimethoxysilylethyl)siloxane-methyl(3-methacryloxypropyl)siloxane copolymers,
3-acryloxypropyldimethoxysiloxy-endblocked methylvinylpolysiloxanes,
3-acryloxypropyldimethoxysiloxy-endblocked dimethylsiloxane-methylvinylsiloxane copolymers,
3-acryloxypropyldiethoxysiloxy-endblocked methylvinylpolysiloxanes,
3-acryloxypropyldiethoxysiloxy-endblocked dimethylsiloxane-methylvinylsiloxane copolymers,
trimethylsiloxy-endblocked methylvinylsiloxane-methyl (trimethoxysilylethyl)siloxane-methyl(3-acryloxypropyl) siloxane copolymers,
trimethylsiloxy-endblocked dimethylsiloxane-methylvinylsiloxane-methyl(trimethoxysilylethyl)siloxane-methyl(3-acryloxypropyl)siloxane copolymers, and
mixtures of two or more selections of the preceding organopolysiloxanes.

Organopolysiloxane containing in each molecule at least 2 silicon-bonded alkenyl and at least 2 of the above-specified acrylic functional groups bonded to silicon can be prepared, for example, by a condensation reaction between organopolysiloxane bearing at least 2 silicon-bonded hydroxyl groups and at least 2 silicon-bonded alkenyl in each molecule and an organosilicon compound that contains both silicon-bonded alkoxy and the above-specified acrylic functionality bonded to silicon. The organopolysiloxane bearing at least 2 silicon-bonded hydroxyl groups and at least 2 silicon-bonded alkenyl in each molecule is exemplified by silanol-endblocked methylvinylpolysiloxanes and silanol-endblocked dimethylsiloxane-methylvinylsiloxane copolymers. The organosilicon compound that contains both silicon-bonded alkoxy and the above-specified acrylic functionality bonded to silicon is exemplified by
3-acryloxypropyltrimethoxysilane,
3-acryloxypropyldimethylmethoxysilane,
3-acryloxypropylmethylbis(trimethylsiloxy)silane,
3-methacryloxypropenyltrimethoxysilane,
3-methacryloxypropyldimethylethoxysilane,
3-methacryloxypropylmethyldiethoxysilane, and
3-methacryloxypropyltris(methoxyethoxy)silane.
The known condensation reaction catalysts can be used in this condensation reaction.

Component (B'), which cures the second-named silicone composition, is an organohydrogenpolysiloxane that has at least 2 silicon-bonded hydrogen atoms in each molecule and that may or may not contain a silicon bonded acrylic functional group having the following formula:

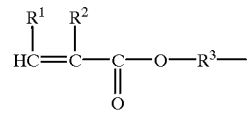

in which $R^1$ is hydrogen or a monovalent hydrocarbon group, $R^2$ is hydrogen or a monovalent hydrocarbon group, and $R^3$ is a $C_1$ to $C_{10}$ divalent hydrocarbon group. Component (B') must have at least 2 silicon-bonded hydrogen atoms in each molecule. When each molecule of component (B') contains fewer than 2 silicon-bonded hydrogen atoms, the corresponding silicone composition will not be thoroughly cured by the hydrosilylation reaction and hence will be unfit for application as a die attach adhesive. The hydrogen can be bonded at terminal or pendant position on the molecular chain. The other silicon-bonded groups in component (B') are preferrably selected from the group consisting of alkyl groups, such as methyl, ethyl, propyl, butyl, pentyl, hexyl, heptyl, octyl, nonyl, decyl and octadecyl; cycloalkyl groups, such as cyclopentyl and cyclohexyl; aryl groups, such as phenyl, tolyl, xylyl and naphthyl; aralkyl groups, such as benzyl, phenethyl and phenylpropyl; halogenated alkyl groups such 3-chloropropyl and 3,3,3-trifluoropropyl; alkoxy groups, such as methoxy, ethoxy, propoxy, butoxy, methoxymethoxy and methoxyethoxy; and a hydroxyl group. Methyl and phenyl are particularly preferred among the preceding. When each molecule of component (A') contains only 1 of the above-defined acrylic functional groups or is entirely free of this functionality, component (B') must then contain in each molecule at least 2 of the subject acrylic functional groups in order to achieve a satisfactory development of the free radical reaction of the acrylic functionality when the corresponding silicone composition is exposed to high-energy radiation. The molecular structure of component (B') can be, for example, straight chain, partially branched straight chain, branched chain, cyclic, or network. The viscosity of component (B') at 25° C. is preferably from 1 to 50,000 centipoise (1 to 50,000 mPa.s) and more preferably from 5 to 1,000 centipoise (5 to 1,000 mPa.s) because such values afford good handling characteristics as well as a good ingredient stability for the ultimately obtained silicone composition.

Component (B') is exemplified by the organopolysiloxanes provided above for component (B). The organopolysiloxanes that also contain the above-defined acrylic functionality bonded to silicon are exemplified by
3-methacryloxypropyldimethoxysiloxy-endblocked methylhydrogenpolysiloxanes,
3-methacryloxypropyldimethoxysiloxy-endblocked dimethylsiloxane-methylhydrogensiloxane copolymers,
3-methacryloxypropyldiethoxysiloxy-endblocked methylhydrogenpolysiloxanes,
3-methacryloxypropyldiethoxysiloxy-endblocked dimethylsiloxane-methylhydrogensiloxane copolymers,
trimethylsiloxy-endblocked methylhydrogensiloxane-methyl(trimethoxysilylethyl)siloxane-methyl(3-methacryloxypropyl)siloxane copolymers,
trimethylsiloxy-endblocked dimethylsiloxane-methyhydrogensiloxane-methyl(trimethoxysilylethyl) siloxane-methyl(3-methacryloxypropyl)siloxane copolymers, 3-acryloxypropyldimethoxysiloxy-endblocked methylhydrogenpolysiloxanes,
3-acryloxypropyldimethoxysiloxy-endblocked dimethylsiloxane-methylhydrogensiloxane copolymers,
3-acryloxypropyldiethoxysiloxy-endblocked methylhydrogenpolysiloxanes,
3-acryloxypropyldiethoxysiloxy-endblocked dimethylsiloxane-methylhydrogensiloxane copolymers,
trimethylsiloxy-endblocked methylhydrogensiloxane-methyl(trimethoxysilylethyl)siloxane-methyl(3-acryloxypropyl)siloxane copolymers,
trimethylsiloxy-endblocked dimethylsiloxane-methylhydrogensiloxane-methyl(trimethoxysilylethyl)siloxane-methyl(3-acryloxypropyl)siloxane copolymers, and
mixtures of two or more selections of the preceding organopolysiloxanes.

(0029)

Organopolysiloxane containing in each molecule at least 2 silicon-bonded hydrogens and at least 2 of the above-specified acrylic functional groups bonded to silicon can be prepared, for example, by a condensation reaction between organopolysiloxane bearing at least 2 silicon-bonded hydroxyl groups and at least 2 silicon-bonded hydrogens in each molecule and an organosilicon compound that contains both silicon-bonded alkoxy and the above-specified acrylic functionality bonded to silicon. The organopolysiloxane bearing at least 2 silicon-bonded hydroxyl groups and at least 2 silicon-bonded hydrogens in each molecule is exemplified by silanol-endblocked methylhydrogenpolysiloxanes and silanol-endblocked dimethylsiloxane-methylhydrogensiloxane copolymers. The organosilicon compound that contains both silicon-bonded alkoxy and the above-specified acrylic functionality bonded to silicon is exemplified by
3-acryloxypropyltrimethoxysilane,
3-acryloxypropyldimethylmethoxysilane,
3-acryloxypropylmethylbis(trimethylsiloxy)silane,
3-methacryloxypropenyltrimethoxysilane,
3-methacryloxypropyldimethylethoxysilane,
3-methacryloxypropylmethyldiethoxysilane, and
3-methacryloxypropyltris(methoxyethoxy)silane.
The known condensation reaction catalysts can be used in this condensation reaction. Another example of preparation consists of the platinum-catalyzed hydrosilylation reaction between organopolysiloxane having at least 3 silicon-bonded hydrogen atoms in each molecule and an organic compound bearing both alkenyl and the above-defined acrylic functionality. The organic compound bearing both alkenyl and the above-defined acrylic functionality is exemplified by allyl methacrylate and 3-methacryloxypropyldimethyl(vinyldimethylsiloxy)silane. The platinum catalysts usable for this hydrosilylation reaction are exemplified by the catalysts provided above for component (D).

Component (B') is added in a quantity that provides from 0.5 to 20 moles silicon-bonded hydrogen in component (B') per 1 mole silicon-bonded alkenyl in component (A'). The hydrosilylation reaction will not yield a thorough cure, and the silicone composition will thus be unfit for application as a die attach adhesive, when component (B') provides the silicone composition with less than 0.5 mole silicon-bonded hydrogen per 1 mole silicon-bonded alkenyl in component (A'). The composition will foam during its cure when component (B') provides more than 20 moles silicon-bonded hydrogen per 1 mole silicon-bonded alkenyl in component (A').

The photosensitizer (C) functions to accelerate the free radical reaction by the acrylic functionality in component (A') and/or component (B') during exposure of the second-named silicone composition to high-energy radiation. Component (C) is exemplified by the same photosensitizers as provided above, with acetophenone, benzoin, benzophenone, and their derivatives again being preferred. Component (C) is added at from 0.01 to 10 weight parts and preferably at from 0.5 to 5 weight parts, in each case per 100 weight parts component (A'). The objects of the present invention cannot be achieved at below 0.01 weight part component (C) per 100 weight parts component (A') due to the resulting weak free radical reaction by the acrylic functionality when the corresponding silicone composition is exposed to high-energy radiation. The silicone composition containing more than 10 weight parts (C) per 100 weight parts (A') suffers from such problems as a poor storage stability and poor handling characteristics.

The platinum catalyst (D) functions to accelerate the hydrosilylation reaction in the second-named silicone composition and is exemplified by the same platinum catalysts as provided above. Component (D) is added in sufficient quantity to cure the second-named silicone composition. In specific terms, component (D) is added in an amount that provides the second-named silicone composition with preferably from 0.01 to 1,000 weight-ppm and more preferably from 0.5 to 500 weight-ppm platinum metal in component (D).

The silicone compositions under consideration may contain an adhesion promoter on an optional basis, for which examples are alkoxysilanes such as tetramethoxysilane, tetraethoxysilane, dimethyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, 3-methacryloxypropyltrimethoxysilane, and the like, and also organopolysiloxane with the following formula

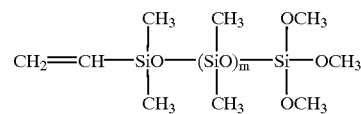

m=a positive number organopolysiloxane with the following formula

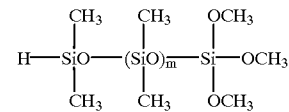

m=a positive number organopolysiloxane with the following general formula

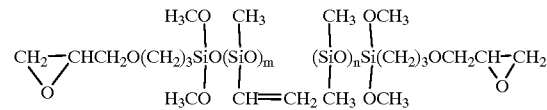

in which m and n are each positive numbers organopolysiloxane with the following formula

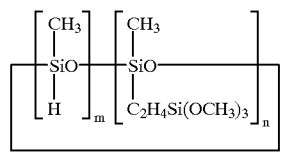

in which m and n are each positive numbers
and organopolysiloxane with the following formula

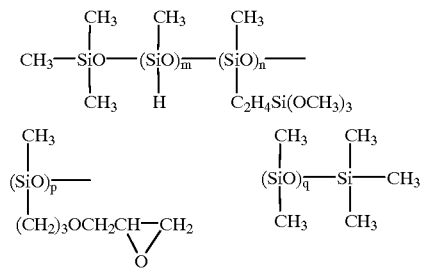

in which m, n, and p are each positive numbers and q is 0 or a positive number.

These adhesion promoters are preferably added at from 0.01 to 20 weight parts and particularly preferably at from 0.1 to 5 weight parts, in each case per 100 weight parts component (A) or (A').

An addition reaction inhibitor can be added on an optional basis to either silicone composition. This addition reaction inhibitor is exemplified by acetylenic compounds such as 3-methyl-1-butyn-3-ol, 3,5-dimethyl-1-hexyn-3-ol, 3-phenyl-1-butyn-3-ol, and so forth; ene-yne compounds such as 3-methyl-3-penten-1-yne, 3,5-dimethyl-3-hexen-1-yne, and so forth; cycloalkenylsiloxanes such as 1,3,5,7-tetramethyl-1,3,5,7-tetravinylcyclotetrasiloxane, 1,3,5,7-tetramethyl-1,3,5,7-tetrahexenylcyclotetrasiloxane, and so forth; triazole compounds such as benzotriazole; and also phosphine compounds, mercaptan compounds, hydrazine compounds, and the like. The addition of the addition reaction inhibitor will vary with the curing conditions, but in general the addition reaction inhibitor is preferably added at from 10 to 1,000 weight-ppm based on the silicone composition.

Each of the silicone compositions under consideration can contain inorganic filler as an optional component, for example, fumed silica, wet-process silica micropowder, quartz micropowder, calcium carbonate micropowder, titanium dioxide micropowder, diatomaceous earth micropowder, aluminum oxide micropowder, aluminum hydroxide micropowder, zinc oxide micropowder, zinc carbonate micropowder, and so forth, or hydrophobic inorganic filler as afforded by treating the surface of the above-listed inorganic fillers with organoalkoxysilane such as methyltrimethoxysilane, organohalosilane such as trimethylchlorosilane, organosilazane such as hexamethyldisilazane, or siloxane oligomer such as hydroxyl-endblocked dimethylsiloxane oligomer, hydroxyl-endblocked methylphenylsiloxane oligomer, and hydroxyl-endblocked methylvinylsiloxane oligomer. Each silicone composition can also contain, for example, organic solvent such as toluene, xylene, acetone, methyl ethyl ketone, methyl isobutyl ketone, hexane, heptane, and so forth; noncrosslinking organopolysiloxane such as trimethylsiloxy-endblocked polydimethylsiloxane, trimethylsiloxy-endblocked polymethylphenylsiloxane, and so forth; flame retardants; heat stabilizers; plasticizers; thixotropy donors; adhesion promoters; and antimolds.

Visible light, ultraviolet radiation, x-rays, electron beam, and the like are examples of the high-energy radiation that can be used to induce the free radical reaction by the acrylic functionality in the silicone die attach adhesives according to the present invention. Ultraviolet radiation is preferred in practice. Exposure to UV radiation preferably employs a light source such as a hydrogen discharge tube, high-pressure mercury lamp, medium-pressure mercury lamp, low-pressure mercury lamp, metal halide lamp, xenon lamp, chemical lamp, carbon arc lamp, and the like. The wavelength of the UV radiation preferably falls in the range from 250 to 400 nm. UV exposure can be carried out, for example, by exposing the silicone die attach adhesive to UV radiation while cooling or heating or at room temperature, in air or a vacuum or under a blanket of an inert gas such as nitrogen or argon. The total UV exposure dose at 250 to 400 nm is preferably $\leq 15$ J/cm$^2$ and more preferably from 1 to 8 J/cm$^2$. Exposure to UV is preferably carried out immediately after the semiconductor chip has been placed on the substrate or in the package. The development of the free radical reaction of the acrylic functionality upon exposure of the silicone die attach adhesive to high-energy radiation can be confirmed by the formation of a skin on or by a thickening of the surface of the die attach adhesive, but is not necessarily accompanied by a change in appearance.

50° C. to 300° C. is the preferred temperature range for the hydrosilylation-based cure of the subject silicone die attach adhesive, while 100° C. to 250° C. is the particularly preferred range for implementing this cure. The silicone die attach adhesive is preferably heated using a heating device such as an infrared radiator, forced convection oven, hot plate, and the like.

The cured product obtained as described above can be, for example, a gel, rubber, or resin with rubbers being preferred. The durometer of the cured rubber product is preferably at least 5, more preferably from 10 to 90, and particularly preferably from 10 to 50, in each case as the JIS A durometer specified in JIS K 6301.

The silicone die attach adhesive according to the present invention has the capacity to inhibit the outmigration of low-molecular-weight silicone oil that occurs prior to the hydrosilylation reaction and during cure by the hydrosilylation reaction. This capacity is achieved through the free radical reaction of the acrylic functionality when the die attach adhesive is exposed to high-energy radiation after the semiconductor chip has been placed on its substrate or in its package using the silicone die attach adhesive according to the present invention. As a consequence of this feature, the semiconductor chip, substrate, package, and lead frame will remain free of contamination by the low-molecular-weight silicone oil, which in turn prevents impaired wire bondability to the semiconductor chip and lead frame and prevents defective bonding between the sealant resin and semiconductor chip, substrate, package, and/or lead frame. Moreover, when the subject components are also to be soldered or conformal coated, the use of the silicone die attach adhesive according to the present invention offers the additional advantage of avoiding solder defects and poor wetting by the coating. Yet another advantage to the silicone die attach adhesive according to the present invention is that its use supports the very highly productive fabrication of semiconductor devices that are very reliable in terms of moisture resistance and the like.

The semiconductor device fabrication method according to the present invention and the semiconductor devices afforded thereby will be explained in detail below.

Figure 2:
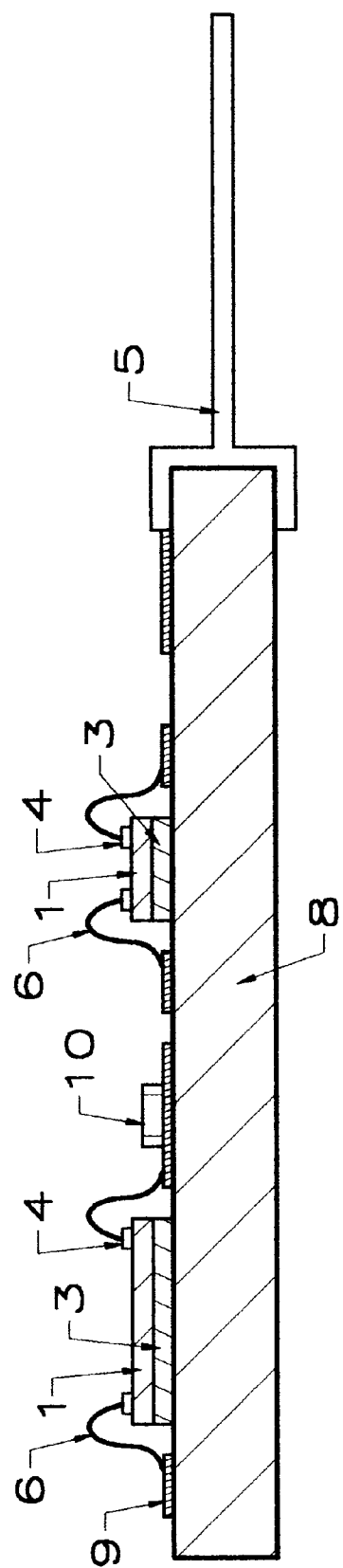
FIG. 2 is a cross-sectional drawing of a semiconductor device within the scope of the present invention.

Semiconductor devices that may be fabricated by the fabrication method according to the present invention are exemplified by diodes, transistors, thyristors, monolithic integrated circuits, hybrid integrated circuits, large-scale integrated circuits, and very large-scale integrated circuits. The semiconductor chip in the semiconductor device is exemplified by diode chips, transistor chips, thyristor chips, monolithic integrated circuit chips, and the semiconductor chip in hybrid integrated circuits. As shown in the example of FIG. 1, the characteristic feature of a semiconductor device fabricated by the method according to the present invention is that the semiconductor chip 1 is bonded to the tab 2 (substrate for mounting of the semiconductor chip) by the cured material afforded by the above-described silicone die attach adhesive. The material making up the tab 2 can be, for example, copper or an iron alloy. In addition, as shown in FIG. 2, a semiconductor device fabricated by the method according to the present invention can use a circuit substrate 8 composed of a material such as ceramic, glass, etc., as the substrate for attachment of the semiconductor chip 1. Circuit interconnects 9 of a metal such as gold, silver, copper, etc., can be formed on the surface of this circuit substrate 8, and electrical elements 10 such as, for example, capacitors, resistors, coils, etc., can also be mounted on the surface of the circuit substrate 8.

The semiconductor device fabrication method according to the present invention comprises first placing the semiconductor chip 1 on the tab 2 or ceramic circuit substrate 8 with the above-described silicone die attach adhesive sandwiched between the semiconductor chip 1 and the tab 2 or ceramic circuit substrate 8 and thereafter exposing the silicone die attach adhesive to high-energy radiation in order to induce the free radical reaction of the acrylic functionality. Visible light, ultraviolet radiation, x-rays, electron beam, and the like are examples of this high-energy radiation, and ultraviolet radiation is preferred in practice. The exposure to UV radiation preferably employs a light source such as a hydrogen discharge tube, high-pressure mercury lamp, medium-pressure mercury lamp, low-pressure mercury lamp, metal halide lamp, xenon lamp, chemical lamp, carbon arc lamp, and the like. The wavelength of the UV radiation preferably falls in the range from 250 to 400 nm. UV exposure can be carried out, for example, by exposing the silicone die attach adhesive to UV radiation while cooling or heating or at room temperature, in air or a vacuum or under a blanket of an inert gas such as nitrogen or argon. The total UV exposure dose at 250 to 400 nm is preferably $\leq 15$ J/cm$^2$ and more preferably from 1 to 8 J/cm$^2$. Exposure to UV is preferably carried out immediately after the semiconductor chip 1 has been placed on the tab 2 or ceramic circuit substrate 8.

The procedure is then continued by curing the silicone die attach adhesive by the hydrosilylation reaction in order to bond the semiconductor chip 1 to the tab 2 or ceramic circuit substrate 8. 50° C. to 300° C. is the preferred temperature range for this hydrosilylation-based cure, while 100° C. to 250° C. is the particularly preferred range for implementing this cure. The silicone die attach adhesive is preferably heated using a heating device such as an infrared radiator, forced convection oven, hot plate, and the like.

The above-described production of the cured product 3 by hydrosilylation cure of the silicone die attach adhesive is followed by wire bonding using gold bonding wires 6 between the aluminum bonding pads 4 installed on the upper edge of the semiconductor chip 1 and the metal lead frame 5 or copper interconnect 9. In addition to gold, the bonding wires can be made of, for example, copper or aluminum. Thermocompression, ultrasonic compression, and ultrasonic thermocompression are examples of the wire bonding procedure. Silicone rubber or silicone gel can then be placed on the surface of the semiconductor chip 1 for the protection thereof. In addition, the semiconductor chip 1 in semiconductor devices according to the present invention can as necessary be sealed by a resin sealant 7. This resin sealant 7 is exemplified by epoxy resins, phenolic resins, and polyphenylene sulfide resins.

EXAMPLES

The silicone die attach adhesive, semiconductor device fabrication method, and semiconductor devices according to the present invention will be explained in greater detail below through working examples. The viscosity values reported in the examples were measured at 25° C. The following methods were used in the examples for determination of the durometer of the cured product afforded by the silicone die attach adhesive, for semiconductor device fabrication, for evaluation of the wire bondability to the semiconductor chip and lead frame, for evaluation of the moisture resistance of the semiconductor devices, and for evaluation of the bonding between the semiconductor chip and sealant resin.

Durometer of the Cured Product Afforded by the Silicone Die Attach Adhesive

Using a conveyor-type UV irradiator (UVC-2533/1MNLC3-AA08 from Ushio Denki Kabushiki Kaisha), the silicone die attach adhesive was exposed to UV from a 160 W/cm high-pressure mercury lamp to give a total exposure dose of 5 J/cm$^2$. This was followed by heating for 30 minutes at 150° C. to give a cured product, whose durometer was measured using the JIS A hardness meter described in JIS K 6301.

Fabrication of Semiconductor Devices and Evaluation of the Wire Bondability

The semiconductor device depicted in FIG. 1 was fabricated. This semiconductor device used a 144-pin out lead frame and a semiconductor chip size of 10 mm×10 mm.

The semiconductor chip 1 was pressed onto the tab 2 with the silicone die attach adhesive sandwiched in between, and the surface of the silicone die attach adhesive that had outflowed around the chip circumference was cured by exposure to UV using a conveyor-type UV irradiator (UVC-2533/1MNLC3-AA08 from Ushio Denki Kabushiki Kaisha) from a 160 W/cm high-pressure mercury lamp to give a total exposure dose of 5 J/cm$^2$. This was followed by heating for 10 minutes at 150° C. to yield the cured product 3. The semiconductor device was then fabricated by wire bonding the aluminum bonding pads 4 elaborated on the top edges of the semiconductor chip 1 to the metal lead frame 5 using gold bonding wires 6. Wire bonding was carried out by ultrasound thermocompression (joining temperature of 160° C. to 250° C., load of 30 to 100 mg each). 20 such semiconductor devices were fabricated. The neck shape between the gold bonding wire 6 and the bonding pad 4 and copper lead frame 5 was investigated by microscopy, at which point the bonding status of the bonding wire 6 was investigated by pulling on the gold bonding wire 6. The wire bondability is reported as the proportion of defective connections by the bonding wires 6.

Evaluation of the Moisture Resistance of the Semiconductor Devices

Semiconductor devices were fabricated by resin-sealing semiconductor chips with well-joined bonding wires 6 using epoxy resin. 20 of these semiconductor devices were heated for the specified period of time in saturated steam at 2 atmospheres and 121° C. After this heating episode electrical current was applied to the semiconductor devices and the leakage current across the copper lead frame 5 was measured. The moisture resistance of the semiconductor devices is reported as the proportion of defective (increased leakage current and presence of continuity defects) semiconductor devices.

Investigation of Bonding Between the Semiconductor Chip and Sealing Resin 20 epoxy resin-sealed semiconductor devices were held for 168 hours at 85° C./85% RH and were thereafter heated by IR reflow at 245° C. This heating episode was followed by examination of the semiconductor devices using an acoustic microscope in order to screen for the presence of delamination produced between the semiconductor chip 1 and epoxy resin sealant. The reported value is the proportion of semiconductor devices in which this delamination appeared.

Example 1

A silicone die attach adhesive was prepared by mixing the following to homogeneity:

100 weight parts of an organopolysiloxane mixture consisting of
- 23.5 weight % of a mixture of 3-methacryloxypropyldimethoxysiloxy-endblocked dimethylpolysiloxane (viscosity=15,000 centipoise) and silicone resin consisting of the $(CH_3)_3SiO_{1/2}$, $CH_2=C(CH_3)COOC_3C_6(CH_3O)_2SiO_{1/2}$, and $SiO_2$ units and
- 76.5 weight % of a mixture (vinyl content=0.9 weight %) of dimethylvinylsiloxy-endblocked dimethylsiloxane-methylvinylsiloxane copolymer and silicone resin consisting of the $(CH_3)_3SiO_{1/2}$, $(CH_2=CH)(CH_3)_2SiO_{1/2}$, and $SiO_2$ units;

7 weight parts dimethylhydrogensiloxy-endblocked methylhydrogensiloxane-dimethylsiloxane copolymer with a viscosity of 30 centipoise and a silicon-bonded hydrogen content of 0.75 weight %;

5 weight parts organopolysiloxane with the formula

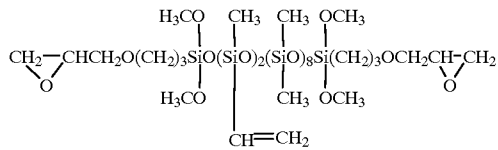

1 weight part benzophenone as photosensitizer;

8 weight parts hydrophobic fumed silica with a specific surface of 200 m²/g, whose surface had been treated with hexamethyldisilazane;

a 1,1,3,3-tetramethyl-1,3-divinyldisiloxane complex of platinum, in a quantity that provided 5 weight-ppm platinum metal in the composition; and 3-phenyl-1-butyn-3-ol, in a quantity that provided 300 weight-ppm in the composition.

Semiconductor devices were fabricated using this silicone die attach adhesive and the results from their evaluation are reported in Table 1.

Example 2

A silicone die attach adhesive was prepared by mixing the following to homogeneity:

100 weight parts of a mixture (vinyl content=0.9 weight %) of dimethylvinylsiloxy-endblocked dimethylsiloxane-methylvinylsiloxane copolymer (viscosity=8,000 centipoise) and silicone resin consisting of the $(CH_3)_3SiO_{1/2}$, $(CH_2=CH)(CH_3)_2SiO_{1/2}$, and $SiO_2$ units;

15 weight parts 3-methacryloxypropyldimethoxysiloxy-endblocked dimethylpolysiloxane;

2.6 weight parts 3-methacryloxypropyl-dimethyl(dimethylsiloxysilyl)-endblocked methylhydrogensiloxane-dimethylsiloxane copolymer with a viscosity of 30 centipoise (30 mPa.s) and a silicon-bonded hydrogen content of 1.0 weight %;

5 weight parts organopolysiloxane with the formula

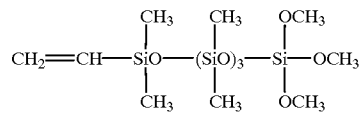

5 weight parts 2-hydroxy-2-methyl-1-phenylpropan-1-one as photosensitizer;

10 weight parts hydrophobic fumed silica with a specific surface of 200 m²/g, whose surface had been treated with hexamethyldisilazane;

a 1,1,3,3-tetramethyl-1,3-divinyldisiloxane complex of platinum, in a quantity that provided 10 weight-ppm platinum metal in the composition; and 3-phenyl-1-butyn-3-ol, in a quantity that provided 500 weight-ppm in the composition.

Semiconductor devices were fabricated using this silicone die attach adhesive and the results from their evaluation are reported in Table 1.

Example 3

A silicone die attach adhesive was prepared by mixing the following to homogeneity:

100 weight parts silicone resin (vinyl content=1.0 weight %) consisting of the $(CH_3)_3SiO_{1/2}$, $CH_2=C(CH_3)COOC_3C_6(CH_3O)_2SiO_{1/2}$, $(CH_2=CH)(CH_3)_2SiO_{1/2}$, and $SiO_2$ units;

12 weight parts dimethylhydrogensiloxy-endblocked methylhydrogensiloxane-dimethylsiloxane copolymer with a viscosity of 30 centipoise (30 mPa.s) and a silicon-bonded hydrogen content of 0.75 weight %;

5 weight parts organopolysiloxane with the formula

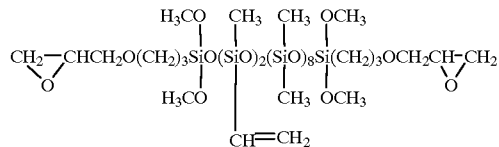

3 weight parts of a 1/1 (weight) mixture of benzophenone and 2-hydroxy-2-methyl-1-phenylpropan-1-one as photosensitizer;

10 weight parts hydrophobic fumed silica with a specific surface of 200 m²/g, whose surface had been treated with hexamethyldisilazane;

a 1,1,3,3-tetramethyl-1,3-divinyldisiloxane complex of platinum, in a quantity that provided 5 weight-ppm platinum metal in the composition; and 3-phenyl-1-butyn-3-ol, in a quantity that provided 250 weight-ppm in the composition.

Semiconductor devices were fabricated using this silicone die attach adhesive and the results from their evaluation are reported in Table 1.

Comparative Example 1

A silicone die attach adhesive was prepared by mixing the following to homogeneity:

100 weight parts dimethylvinylsiloxy-endblocked dimethylpolysiloxane with a viscosity of 2,000 centipoise (2,000 mPa.s) and a vinyl content of 0.2 weight %;

1.1 weight parts trimethylsiloxy-endblocked methylhydrogenpolysiloxane with a viscosity of 20 centipoise and a silicon-bonded hydrogen content of 1.5 weight %;

1 weight part organopolysiloxane with the formula

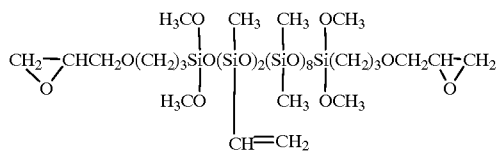

9 weight parts hydrophobic fumed silica with a specific surface of 200 m²/g, whose surface had been treated with hexamethyldisilazane;

a 1,1,3,3-tetramethyl-1,3-divinyldisiloxane complex of platinum, in a quantity that provided 5 weight-ppm platinum metal in the composition; and 3-phenyl-1-butyn-3-ol, in a quantity that provided 250 weight-ppm in the composition.

Semiconductor devices were fabricated using this silicone die attach adhesive and the results from their evaluation are reported in Table 1.

Comparative Example 2

Semiconductor devices were fabricated as in Comparative Example 1 using the silicone die attach adhesive prepared in Comparative Example 1, but in this case without exposure to UV radiation. The results from their evaluation are reported in Table 1.

Comparative Example 3

Semiconductor devices were fabricated as in Example 1 using the silicone die attach adhesive prepared in Example 1, but in this case without exposure to UV radiation. The results from their evaluation are reported in Table 1.

The silicone die attach adhesive according to the present invention comprises a silicone composition that cures both by the free radical reaction of acrylic-functional organopolysiloxane under exposure to high-energy radiation and by hydrosilylation between alkenyl-functional organopolysiloxane and SiH-functional organopolysiloxane. As a consequence, this die attach adhesive is characterized by the capacity during bonding of the semiconductor chip to a substrate or package to inhibit the low-molecular-weight silicone oil outmigration that causes impaired wire bondability to the semiconductor chip and/or lead frame and defective bonding between the resin sealant and semiconductor chip, substrate, package, and/or lead frame. Because the fabrication method according to the present invention uses the aforesaid die attach adhesive, this method is characterized by the capacity to suppress impaired wire bondability to the semiconductor chip and/or lead frame and defective bonding between the resin sealant and semiconductor chip, substrate, package, and/or lead frame. Finally, since semiconductor devices according to the present invention are fabricated by the fabrication method according to the present invention, these semiconductor devices are characterized by an excellent reliability in terms of their moisture resistance and the like.

That which is claimed is:

1. A silicone die attach adhesive prepared from a siloxane composition wherein said siloxane composition is curable via both a free radical reaction of an acrylic-functional organopolysiloxane as induced upon exposure to high-energy radiation and a hydrosilylation reaction between an alkenyl-functional organopolysiloxane and a silicon-bonded hydrogen-functional organopolysiloxane.

2. A siloxane composition, comprising:

(A) 100 parts by weight parts of an organopolysiloxane composition comprising (a) 5 to 95 weight % of an acrylic functional group containing organopolysiloxane having an average of at least two silicon-bonded acrylic functional groups per molecule, said silicon bonded acrylic functional groups having the formula:

TABLE 1

|  | Invention Examples | | | Comparative Examples | | |
| --- | --- | --- | --- | --- | --- | --- |
|  |  |  |  | Comp. | Comp. | Comp. |
|  | Example 1 | Example 2 | Example 3 | Example 1 | Example 2 | Example 3 |
| durometer of the cured product afforded by the silicone die attach adhesive (JIS A) | 25 | 30 | 50 | 25 | 25 | 25 |
| proportion of bonding defects at the bonding wires | 0/2880 | 0/2880 | 0/2880 | 280/2880 | 280/2880 | 300/2880 |
| proportion of semiconductor devices with defective moisture resistance |  |  |  |  |  |  |
| after 48 hours | 0/20 | 0/20 | 0/20 | 4/20 | 5/20 | 8/20 |
| after 168 hours | 0/20 | 0/20 | 0/20 | 8/16 | 8/15 | 8/12 |
| after 504 hours | 0/20 | 0/20 | 0/20 | 8/8 | 7/7 | 4/4 |
| proportion of semiconductor devices in which delamination between the semiconductor chip and sealant resin occurred | 0/20 | 0/20 | 0/20 | 16/20 | 16/20 | 16/20 |

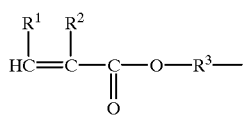

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group; and (b) 95 to 5 weight % of an alkenyl group containing organopolysiloxane having an average of at least two silicon-bonded alkenyl groups per molecule;

(B) a silicon-bonded hydrogen atom containing organopolysiloxane having an average of at least two silicon-bonded hydrogen atoms per molecule, in a quantity that provides from 0.5 to 20 moles silicon-bonded hydrogen from component (B) per 1 mole silicon-bonded alkenyl in component (b);

(C) 0.01 to 10 parts by weight of a photosensitizer; and (D) platinum catalyst in sufficient quantity to cure the curable siloxane compositions;

wherein said siloxane composition is curable, via both
(i) free radical reaction of an acrylic-functional organopolysiloxane as induced upon exposure to high-energy radiation; and
(ii) hydrosilylation reaction between an alkenyl-functional organopolysiloxane and a silicon-bonded hydrogen-functional organopolysiloxane.

3. The product obtained from incipient materials:

(A) 100 parts by weight parts of an organopolysiloxane composition comprising
(a) 5 to 95 weight % of an acrylic functional group containing organopolysiloxane having an average of at least two silicon-bonded acrylic functional groups per molecule, said silicon bonded acrylic functional groups having the formula:

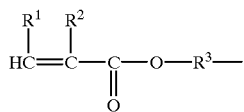

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group; and (b) 95 to 5 weight % of an alkenyl group containing organopolysiloxane having an average of at least two silicon-bonded alkenyl groups per molecule;

(B) a silicon-bonded hydrogen atom containing organopolysiloxane having an average of at least two silicon-bonded hydrogen atoms per molecule, in a quantity that provides from 0.5 to 20 moles silicon-bonded hydrogen from component (B) per 1 mole silicon-bonded alkenyl in component (b);

(C) 0.01 to 10 parts by weight of a photosensitizer; and (D) a platinum catalyst.

4. The product obtained from incipient materials:

(A') 100 parts by weight parts of an alkenyl group containing organopolysiloxane having an average of at least two silicon-bonded alkenyl groups per molecule;

(B') a silicon-bonded hydrogen atom containing organopolysiloxane having an average of at least two silicon-bonded hydrogen atoms per molecule, in a quantity that provides from 0.5 to 20 moles silicon-bonded hydrogen from component (B) per 1 mole silicon-bonded alkenyl in component (A');

(C) 0.01 to 10 parts by weight of a photosensitizer; and (D) a platinum catalyst;
wherein at least one component selected from the group consisting of component (A') component (B') has an average of at least two silicon-bonded acrylic functional groups per molecule having the formula:

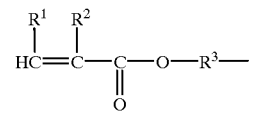

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group.

5. A siloxane composition, comprising:

(A') 100 parts by weight parts of an alkenyl group containing organopolysiloxane having an average of at least two silicon-bonded alkenyl groups per molecule;

(B') a silicon-bonded hydrogen atom containing organopolysiloxane having an average of at least two silicon-bonded hydrogen atoms per molecule, in a quantity that provides from 0.5 to 20 moles silicon-bonded hydrogen from component (B) per 1 mole silicon-bonded alkenyl in component (A');

(C) 0.01 to 10 parts by weight of a photosensitizer; and (D) platinum catalyst in sufficient quantity to cure the curable siloxane composition wherein said siloxane composition is curable, via both
(i) a free radical reaction of an acrylic-functional organopolysiloxane as induced upon exposure to high-energy radiation; and
(ii) a hydrosilylation reaction between an alkenyl-functional organopolysiloxane and a silicon-bonded hydrogen-functional organopolysiloxane, and wherein at least one component selected from the group consisting of component (A') and component (B') has an average of at least two silicon-bonded acrylic functional groups having the formula:

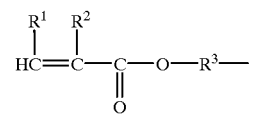

wherein $R^1$ is hydrogen or a monovalent hydrocarbon group, $R^2$ is hydrogen or a monovalent hydrocarbon group, and $R^3$ is a $C_1$ to $C_{10}$ divalent hydrocarbon group.

6. A semiconductor device, comprising:
1) a semiconductor chip;
2) a substrate; and
3) the silicone die attach adhesive of claim 1, wherein said silicone die attach adhesive connects said semiconductor chip to said substrate.

7. A semiconductor device, comprising:
1) a semiconductor chip;
2) a substrate; and 3) the siloxane composition of claim 2, wherein said siloxane composition connects said semiconductor chip to said substrate.

8. A semiconductor device, comprising:
1) a semiconductor chip;
2) a substrate; and
3) the product of claim 3, wherein said product connects said semiconductor chip to said substrate.

9. A semiconductor device, comprising:
1) a semiconductor chip;
2) a substrate; and
3) the product of claim 4, wherein said product connects said semiconductor chip to said substrate.

10. A semiconductor device, comprising:
1) a semiconductor chip;
2) a substrate; and
3) the siloxane composition of claim 5, wherein said siloxane composition connects said semiconductor chip to said substrate.

11. A method for fabricating a semiconductor device, said method comprising the steps of:
providing a semiconductor chip;
providing a substrate;
connecting said semiconductor chip to said substrate using the silicone die attach of claim 1;
then inducing a free radical reaction of the acrylic functional groups of said acrylic-functional organopolysiloxane of said silicone die attach adhesive by exposing said silicone die attach adhesive to high-energy radiation; and thereafter
curing said silicone die attach adhesive via a hydrosilylation reaction.

12. A method for fabricating a semiconductor device, said method comprising the steps of:
providing a semiconductor chip;
providing a substrate;
connecting said semiconductor chip to said substrate using the siloxane composition of claim 2;
then inducing a free radical reaction of the acrylic functional groups of said component (a) of said siloxane composition by exposing said siloxane composition to high-energy radiation; and thereafter
curing said siloxane composition via a hydrosilylation reaction.

13. A method for fabricating a semiconductor device, said method comprising the steps of:
providing a semiconductor chip;
providing a substrate;
connecting said semiconductor chip to said substrate using the siloxane composition of claim 5;
then inducing a free radical reaction of said acrylic functional groups by exposing said siloxane composition to high-energy radiation; and thereafter
curing said hydrosilylation composition via a hydrosilylation reaction.

* * * * *